United States Patent [19]
Vakhshoori

[11] Patent Number: 5,390,209
[45] Date of Patent: Feb. 14, 1995

[54] ARTICLE COMPRISING A SEMICONDUCTOR LASER THAT IS NON-DEGENERATE WITH REGARD TO POLARIZATION

[75] Inventor: Daryoosh Vakhshoori, Chatham Township, Morris County, N.J.

[73] Assignee: AT&T Corp., Murray Hill, N.J.

[21] Appl. No.: 177,503

[22] Filed: Jan. 5, 1994

[51] Int. Cl.⁶ ............................................. H01S 3/19
[52] U.S. Cl. ........................................ 372/45; 372/27
[58] Field of Search .............................. 372/45, 27, 96

[56] References Cited

U.S. PATENT DOCUMENTS

| | | | |
|---|---|---|---|
| 4,949,350 | 8/1990 | Jewell et al. | 372/45 |
| 4,980,892 | 12/1990 | Cunningham et al. | 372/45 |
| 4,982,408 | 1/1991 | Shimizu | 372/45 |

OTHER PUBLICATIONS

"Performance of Gain-Guided Surface Emitting Lasers with Semiconductor Distributed Bragg Reflectors", by G. Hasnain et al., *IEEE Journal of Quantum Electronics*, vol. 27, No. 6, Jun. 1991, pp. 1377–1385.

"Top-suface Emitting Lasers with 1.9 V Threshold Voltage and the Effect of Spatial Hole Burning on their Transverse Mode Operation and Efficiencies", by D. Vakhshoori et al., *Applied Physics Letters*, vol. 62(13), Mar. 29, 1993, pp. 1448–1450.

"Engineered Polarization Cointrol of GaAs/AlGaAs Surface-Emitting Lasers by Anisotropic Stress and Elliptical Etched Substrate Hole", by T. Mukaihara et al., *IEEE Photonics Technology Letters*, vol. 5, No. 2, Feb. 1993, pp. 133–135.

"CTuN1 Transverse-Mode Engineering in Vertical Cavity-Surface Emitting Lasers", by K. D. Choquette et al., Conference on Lasers and Electro-Optics (IEEE/OSA, Baltimore, Md. 1993), p. 148.

Primary Examiner—Georgia Y. Epps
Attorney, Agent, or Firm—Eugen E. Pacher

[57] ABSTRACT

The output of vertical cavity surface emitting layers (VC-SELs) generally lacks polarization stability due to polarization mode degeneracity. I have discovered that in the usual (001) laser geometry polarization mode degeneracity can be removed if the active region of the laser is selected such that the active region lacks mirror symmetry with respect to any plane normal to the [001] crystal direction. Exemplarily, the active region comprises one or more asymmetrical quantum wells, e.g., quantum wells having a saw-tooth profile. The invention can also be embodied in edge emitting lasers, but embodiment in VC-SELs is preferred.

6 Claims, 2 Drawing Sheets

ARTICLE COMPRISING A SEMICONDUCTOR LASER THAT IS NON-DEGENERATE WITH REGARD TO POLARIZATION

FIELD OF THE INVENTION

This application pertains to semiconductor lasers, preferably, to vertical cavity surface emitting lasers (VC-SELs).

BACKGROUND OF THE INVENTION

VC-SELs are known. See, for instance, G. Hasnain et al., *IEEE Journal of Quantum Electronics*, Vol. 27, No. 6, pp. 1377–1385 (1993), and D. Vakhshoori et al., *Applied Physics Letters*, Vol. 62, pp. 1448–1450 (1993). Such devices are potentially attractive for, e.g., system applications requiring an array of lasers, e.g., for 2-dimensional optical processing. VC-SELs can have low power consumption, typically emit a beam of radiation having circular cross section, and can be produced with high yield. These are all desirable attributes. However, prior art VC-SELs typically also have an undesirable attribute, namely, lack of polarization stability. As those skilled in the art will realize, polarization instability results in polarization partition noise, and is inherently detrimental for systems requiring coherent and high speed laser operation. Furthermore, even if the polarization were fixed, as long as the polarization is randomly oriented the design of optical systems will be complicated by this randomness. Desirably, the polarization should be linearly fixed in a pre-determined direction.

Attempts have been made to produce a polarization-stable VC-SEL by applying biaxial stress, and by transverse mode engineering. See T. Mukaihara et al., *IEEE Photonic Technology Letters*, Vol. 5, pp. 133–135 (1993), and K. D. Choquette et al., "Conference on Lasers and Electro-Optics" (IEEE/OSA, Baltimore, Md. 1993), p. 148, CTuN1, respectively). However, these approaches are difficult to implement, and typically do not provide a satisfactory solution to the mode instability problem. In view of the potential advantages of a polarizations-table VC-SEL, it would be highly desirable to have available a relatively simple, readily manufacturable polarization-stable VC-SEL with a predetermined polarization direction. This application discloses such a device.

THE INVENTION

In a broad aspect the invention is embodied in an article that comprises a semiconductor laser, preferably a VC-SEL but not excluding an edge-emitting laser, of a design that inherently removes polarization degeneracy.

More particularly, a laser according to the invention comprises a multilayer epitaxial semiconductor structure. Associated with that structure is a direction normal to the structure and a crystal orientation such that the [001] crystal direction is substantially parallel to the direction normal to the structure. The structure comprises an active region, and means that facilitate flowing charge carriers into said active region. Significantly, the active region has a chemical composition that varies in the direction normal to the structure such that the active region does not have mirror symmetry with respect to any plane that is normal to said [001] crystal direction.

The invention can be embodied in VC-SELs and in edge emitting lasers. The former are currently preferred, since in the latter polarization-degeneracy typically is lifted by other means.

Figure 1:
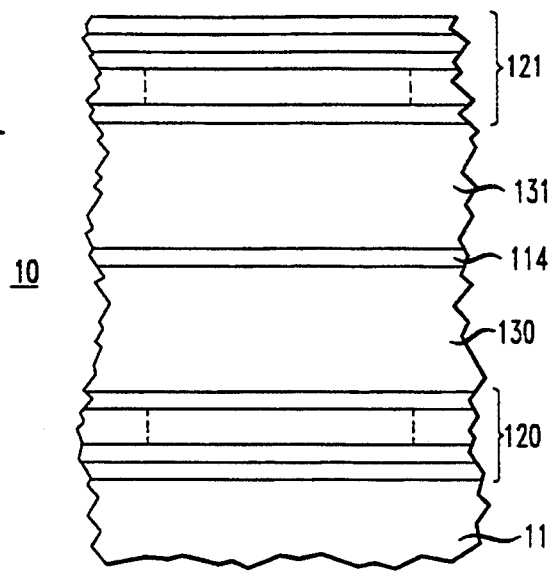
FIG. 1 schematically depicts an exemplary semiconductor layer structure which can be transformed into a VC-SEL by conventional processing.

FIG. 1 schematically depicts an exemplary semiconductor layer structure 10 which can be transformed into a VC-SEL by conventional processing. Numeral 11 refers to the semiconductor substrate (e.g., n+ GaAs), numerals 120 and 121 to bottom and top mirror stacks, respectively, numerals 130 and 131 to bottom and top cladding, respectively, and numeral 14 to the active layer (e.g., comprising asymmetric quantum wells, including an asymmetric superlattice).

Figure 2:
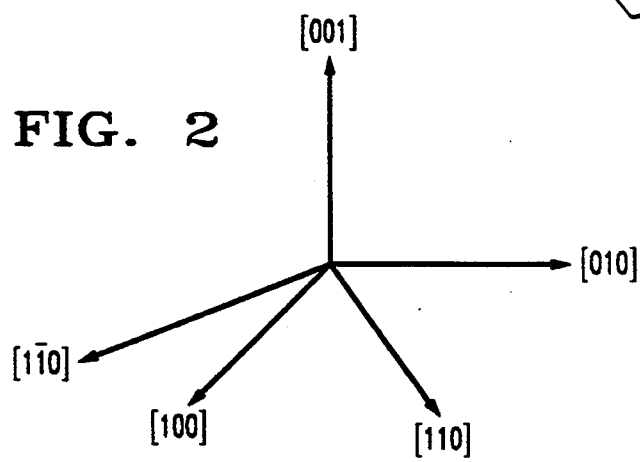
FIG. 2 shows relevant crystal lattice direction for a cubic lattice.

FIG. 2 shows relevant crystal lattice directions for a cubic lattice. The directions are designated by the conventional Miller indices. As is well known, in a cubic lattice a given lattice direction is perpendicular to the corresponding lattice plane. Thus, the [001] direction is perpendicular to the (001) plane.

Figure 3:
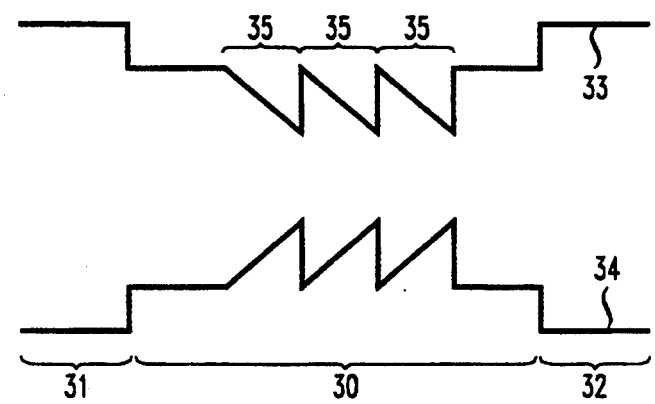
FIG. 3 shows an active region with 3 quantum wells.

Group-theoretical analysis of the symmetry properties of various VC-SEL geometries has revealed designs in which the degeneracy of the relevant transverse polarizations is lifted. The analysis was limited to III-V semiconductor materials relevant for lasers, and the results apply to all such III-V semiconductors, e.g., GaAs, InP, and the ternary and quaternary alloys thereof, e.g., GaInAsP (which is a customary shorthand designation for $Ga_xIn_{1-x}As_yP_{1-y}$). In particular, I have discovered that the polarization degeneracy is lifted in (001)-oriented VC-SELs or edge emitting laser if the active region of the device lacks reflection symmetry about any plane parallel to the (001) crystal planes, and thus parallel to the quantum well(s) in the active region. This is schematically illustrated in FIG. 3, which shows the band edges associated with the semiconductor material in active region 30 sandwiched between cladding regions 31 and 32. Numerals 33 and 34 designate the conduction band edge and valence band edge, respectively. It will be appreciated that FIG. 3 pertains to VC-SELs as well as to edge emitting layers.

FIG. 3 shows an active region with 3 quantum wells. This is exemplary only, and more or fewer quantum wells can be used. Furthermore, composition profiles other than a profile that results in a saw tooth-shaped quantum well can be used, provided that the composition profile lacks mirror symmetry in any plane parallel to the (001) crystal planes. It will be appreciated that FIG. 3 shows band edges, but that for III-V semiconductors the band edges typically are composition dependent. For instance, $In_xGa_{1-x}A_yP_{1-y}$ that is lattice matched to InP, a given value of the band gap energy corresponds to given values of x and y. This is well known to those skilled in the art.

Figure 4:
FIGS. 4–6 illustrate other exemplary composition profiles that meet the above specified requirement of lack of reflection symmetry.
Figure 4:
Figure 5:
Figure 5:
Figure 6:
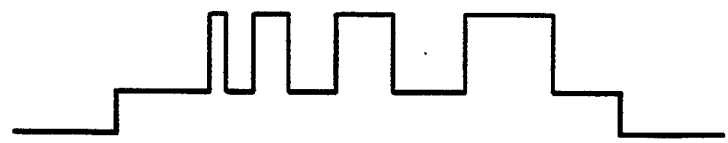

FIGS. 4–6 illustrate other exemplary composition profiles that meet the above specified requirement of lack of reflection symmetry. Attention is drawn to the fact that the compositional variation of the active region need not be periodic. However, periodic variations are currently preferred. The illustrated quantum wells (as well as other asymmetric quantum wells) can be produced by known techniques, e.g, by MBE.

Desirably, the quantum wells in a VC-SEL according to the invention have thickness comparable to the Bohr exciton radius in the quantum well semiconductor material. The Bohr exciton radius $r_B$ in III-V semiconductor materials is well known to be of order 102 times the radius of a hydrogen atom. The quantum well thickness is "... comparable to ..." $r_B$ if the quantum well thickness t is in the approximate range 0.05 $r_B$ to $r_B$. Preferably t is in the range 0.5–10 nm.

Providing a (001)-oriented semiconductor layer structure comprising an asymmetric (i.e., lacking reflection symmetry in (001) planes) gain region can result in a lifting of the gain degeneracy for the two transverse polarizations modes of the output of a VC-SEL manufactured from the layer structure. The eigen-directions of the gain tensor of the resulting VC-SEL are [110] and [1$\overline{1}$0]. The output of a VC-SEL according to the invention thus will have a polarization vector that is parallel to a {110} direction of the crystal lattice of the device. Lasers according to the invention can be made by any process that is suitable for laser manufacture, provided that the process is capable of providing an asymmetric active region as described above.

EXAMPLE 1

On a conventional (001)-oriented n+ GaAs substrate ($10^{18}$ cm$^{-3}$ Si) is grown by conventional MBE at about 600° C. a layer structure comprising, in sequence, a 0.5 μm n+ GaAs buffer layer ($2\times10^{18}$ cm$^{-3}$ Si), a n+ AlGaAs lower mirror ($2\times10^{18}$ cm$^{-3}$ Si), a 80 nm n$^-$ $Al_{0.3}Ga_{0.7}$As lower cladding layer ($10^{17}$ cm$^{-3}$ Si), an essentially undoped active region, a 80 nm p$^-$ $Al_{0.3}Ga_{0.7}$As upper cladding layer ($5\times10^{17}$ cm$^{-3}$ Be), a p-type AlGaAs upper mirror, and a 5 nm p++ GaAs cap layer ($2\times10^{19}$ cm$^{-3}$ Be). The lower mirror consists of 30 pairs of layers, the layer thicknesses selected such that the optical thickness of each pair is λ/2, where λ is the wavelength of the laser light. A pair consists of a layer of $Al_{0.56}Ga_{0.44}As$, followed by a layer of AlAs, followed by a layer of $Al_{0.56}Ga_{0.44}As$, which in turn is followed by a layer of $Al_{0.16}Ga_{0.84}As$. The upper mirror is identical to the lower mirror, except that is contains only 20 pairs of layers, with the first two pairs being doped with $2\times10^{18}$ cm$^{-3}$ Be, the next 14 pairs being doped with $5\times10^{18}$ cm$^{-3}$ Be, and the last four pairs with $2\times10^{19}$ cm$^{-3}$ Be. The active region contains 3 asymmetric quantum wells. Starting from the lower cladding layer, the layer sequence of the active region is as follows. Two monolayers (ML) of AlAs/4 ML of GaAs/2 ML of InAs/2 ML of AlAs/4 ML of GaAs . . . /2 ML of InAs/2 ML of AlAs. For the relevant semiconductors a ML is about 0.56 nm. The quantum well periodicity thus is about 4.5 nm.

After conventional metallization, proton implantation (300 keV, resulting in 2.3 μm depth of the implant) is used to laterally define the active region of the respective lasers. Conventional oxygen implantation is used to isolate the lasers. After conventionally polishing the back side of the substrate, contact metal (AuGe/Ni/Au) is deposited to provide an ohmic contact, and the lasers are tested. The tests inter alia show that the lasers have output polarized in a <110> direction in the (001) plane.

EXAMPLE 2

An edge emitting laser is fabricated on a (001)-oriented GaAs substrate in conventional fashion, except that the active region contains 3 asymmetric quantum wells as described in Example 1. The laser has an output that is polarized in a <110> direction in the (001) plane.

I claim:

1. An article comprising a semiconductor laser comprising a multilayer epitaxial semiconductor structure comprising III-V semiconductor material, associated with said structure being a direction normal to the structure and a crystal orientation such that the crystal direction is substantially parallel to said direction normal to the structure, the structure comprising an active region between first and second cladding regions, the article further comprising contact means that facilitate flowing charge carriers into said active region.

CHARACTERIZED IN THAT said active region has a composition selected such that the active region does not have mirror symmetry with respect to any plane that is normal to said [001] crystal direction.

2. An article according to claim 1, wherein the semiconductor laser is a vertical cavity surface emitting laser comprising first and second reflection means that are substantially parallel to said active region.

3. An article according to claim 1, wherein the active region comprises one or more quantum wells, with at least one of said quantum wells lacking mirror symmetry with respect to any plane that is normal to said [001] crystal direction.

4. An article according to claim 3 comprising a multiplicity of substantially identical quantum wells, with substantially constant repeat distance.

5. An article according to claim 3 comprising a multiplicity of quantum wells, with at least one quantum well differing in thickness from at least one other quantum well.

6. An article according to claim 4, wherein the repeat distance is in the range 0.5–10 nm.

* * * * *

UNITED STATES PATENT AND TRADEMARK OFFICE
CERTIFICATE OF CORRECTION

PATENT NO. : 5,390,209
DATED : February 14, 1995
INVENTOR(S) : Daryoosh Vakhshoori It is certified that error appears in the above-indentified patent and that said Letters Patent is hereby corrected as shown below:

Column 4, line 26, "the crystal" should read --the [001[ crystal--.

Signed and Sealed this

Twentieth Day of June, 1995

*Attest:*

BRUCE LEHMAN

*Attesting Officer*     *Commissioner of Patents and Trademarks*